(12) United States Patent
Caillerie et al.

(10) Patent No.: US 9,559,724 B2
(45) Date of Patent: Jan. 31, 2017

(54) METHOD AND DEVICE FOR PROCESSING RECEIVED DATA

(71) Applicant: CANON KABUSHIKI KAISHA, Tokyo (JP)

(72) Inventors: Alain Caillerie, Rennes (FR); Mounir Achir, Chantepie (FR); Yacine El Kolli, Rennes (FR); Mickaël Lorgeoux, Rennes (FR)

(73) Assignee: CANON KABUSHIKI KAISHA, Tokyo (JP)

( * ) Notice: Subject to any disclaimer, the term of this patent is extended or adjusted under 35 U.S.C. 154(b) by 82 days.

(21) Appl. No.: 14/276,847

(22) Filed: May 13, 2014

(65) Prior Publication Data

US 2014/0344649 A1 Nov. 20, 2014

(30) Foreign Application Priority Data

May 16, 2013 (GB) .................................. 1308833.1

(51) Int. Cl.
*H03M 13/11* (2006.01)
*H03M 13/29* (2006.01)
*H03M 13/09* (2006.01)

(52) U.S. Cl.
CPC ..... *H03M 13/2915* (2013.01); *H03M 13/2927* (2013.01); *H03M 13/2948* (2013.01); *H03M 13/09* (2013.01)

(58) Field of Classification Search
CPC .............. H03M 13/2948; H03M 13/09; H03M 13/2927; H03M 13/2915; H03M 13/1105
See application file for complete search history.

(56) References Cited

U.S. PATENT DOCUMENTS

| | | | | |
|---|---|---|---|---|
| 5,832,197 | A * | 11/1998 | Houji | ...................... H04L 45/10 709/239 |
| 6,557,124 | B1 | 4/2003 | Cideciyan et al. | |
| 2002/0174403 | A1 | 11/2002 | Chethik | |
| 2003/0063587 | A1* | 4/2003 | Cho | ........................ H04L 1/0025 370/335 |
| 2005/0193319 | A1* | 9/2005 | Christensen | ........ H03M 13/098 714/800 |
| 2009/0257386 | A1* | 10/2009 | Achir | ...................... H04L 25/14 370/329 |

(Continued)

*Primary Examiner* — Albert Decady
*Assistant Examiner* — Kyle Vallecillo
(74) *Attorney, Agent, or Firm* — Canon USA, Inc. IP Division

(57) ABSTRACT

A method and device for decoding a plurality of packets of same data. Each packet is encoded using a product code. An encoded packet comprises data blocks is organized into rows and columns. Each of the rows and columns has a respective error detecting code. For a data packet, Erroneous row and column data are detected by their associated error detecting code. In the data packet, a potentially erroneous data block belonging to a row and a column of data blocks both having been detected as erroneous is detected. In another data packet of the same data, a non-erroneous data block corresponding to the identified potentially erroneous data block is determined. The data block is determined as non-erroneous if it belongs to at least one row or column of data having been detected as non-erroneous. The identified potentially erroneous block is replaced with the determined non-erroneous block.

19 Claims, 9 Drawing Sheets

(56) References Cited

U.S. PATENT DOCUMENTS

| | | |
|---|---|---|
| 2010/0218037 A1 | 8/2010 | Swartz et al. |
| 2013/0013975 A1 | 1/2013 | Yasufuku |
| 2014/0157093 A1* | 6/2014 | Achir ................ H03M 13/1111 714/776 |

* cited by examiner

METHOD AND DEVICE FOR PROCESSING RECEIVED DATA

This application claims the benefit under 35 U.S.C. §119 (a)-(d) of United Kingdom Patent Application No. 1308833.1, filed on May 16, 2013 and entitled "Method and device for processing received data". The above cited patent application is incorporated herein by reference in its entirety.

FIELD OF THE INVENTION

The present invention concerns a method and an apparatus for processing received data. More particularly the present invention relates to the correction of received data which has been subject to transmission errors. Embodiments of the invention may find application in wireless personal area network (W-PAN) operating at millimeter wave frequencies.

BACKGROUND

Wireless A/V (audio/video) applications are becoming increasingly numerous and require ever higher data bit rates of the order of Gigabits per second (Gbps) and an increasingly higher quality of service. W-PAN millimeter type networks are particularly well suited to this type of application. Indeed, the authorized band around a carrier frequency of 60 GHz offers a wide bandwidth thus enabling the transportation of a large quantity of data. Moreover, the radio range of such systems is limited to about ten meters, favouring the re-utilization of the frequencies in time and space. A typical characteristic of millimeter waves is their sensibility to masking phenomenon; static or moving obstacles such as furniture, objects, humans etc. can block or disrupt the communication path causing transmission errors.

Since in high speed A/V wireless systems, the available bandwidth is mainly dedicated to the transmission of the data application, the amount of bandwidth used for control or protocol should be minimized.

Point to point transmissions over millimeter waves often suffer from low Signal to Noise ratios (SNR) and from shadowing. Consequently optimized paths between the emitter transmitting the data and the receiver of the data are required. This signifies that transmissions should be performed only through reliable paths so as to limit the number of potential retransmissions. However the reliability of transmission paths can never be guaranteed.

The present invention has been devised to address one or more of the foregoing concerns.

SUMMARY

According to a first aspect of the invention there is provided a method of decoding a plurality of packets of same data, wherein each packet is encoded using a product code and an encoded packet comprises data blocks organized into rows and columns, each row having a respective error detecting code and each column having a respective error detecting code the method comprising for each data packet:

detecting erroneous row and column data by means of their associated error detecting code;

identifying, in the data packet, a potentially erroneous data block that belongs to a row and a column of data blocks that both have been detected as erroneous;

determining, in another data packet of the same data, a non-erroneous data block corresponding to the identified potentially erroneous datablock, wherein the data block is determined as non-erroneous if it belongs to at least one row of data or one column of data that has been detected as non-erroneous; and replacing the identified potentially erroneous block by the determined non-erroneous block.

Embodiments of the invention enable more precise detection of potentially erroneous data, and determination of their location. The detection of potentially erroneous data is performed by means of error detecting codes such as CRC product codes: when a row having a computed error detecting code mismatches the received error detecting code for that row and when a column having a computed error detecting code mismatches the received error detecting code of that column, the data value at the intersection of the row and column is considered to be potentially erroneous. This may be performed for a plurality of data packets which in some embodiments of the invention are associated with a respective communication path, thereby enabling the communication paths to be assessed.

By virtue of the columns size arrangement, embodiments may be applied to any type of data width and not just to byte width data organization.

In an embodiment, the detecting step comprises comparing, for a row or column of data, a computed error detecting code of that row or column of data with the respective received error detecting code of that row or column of data.

In an embodiment, in the case where there is a mismatch between the computed error detecting code and the respective received error detecting code, the method includes comparing the computed error detecting code with a received detecting code of the corresponding row or column of another data packet of the same data.

In an embodiment, in the case where the computed error detecting code matches a received detecting code of the corresponding row or column of the other data packet of the same data, the method includes replacing the mismatching received error detecting code with the received detecting code of the corresponding row or column of the other data packet In an embodiment, the steps of detecting, identifying, determining and replacing are repeated for each data packet until a predetermined condition of a set of predetermined conditions is met.

In an embodiment, the set of predetermined conditions includes reaching a maximum allowed number of iteration, determining that one of the data packets does not contain any erroneous data blocks and/or the remaining number of potentially erroneous data blocks in each data packet has not decreased since the preceding iteration.

In an embodiment, the method includes counting the detected potentially erroneous blocks for each data packet.

In an embodiment, each data packet is associated with a communication path, the method further comprising selecting the communication path associated with the data packet having the lowest count of erroneous blocks for transmission of data.

In an embodiment, the selected communication path is used to transmit acknowledgement of reception of the data packets.

A second aspect of the invention provides a device for decoding a plurality of packets of same data, wherein each packet is encoded using a product code and an encoded packet comprises data blocks organized into rows and columns, each row having a respective error detecting code and each column having a respective error detecting code the device comprising:

an error detector for detecting, in a data packet, erroneous row and column data by means of their associated error detecting code and for identifying, in a data packet, a potentially erroneous data block that belongs to a row and a column of data blocks that both have been detected as erroneous;

a processor for determining, in another data packet of the same data, a non-erroneous data block corresponding to the identified potentially erroneous datablock, wherein the data block is determined as non-erroneous if it belongs to at least one row of data or one column of data that has been detected as non-erroneous; and replacing the identified potentially erroneous block by the determined non-erroneous block.

In an embodiment, the error detector comprises a comparator for comparing, for a row or column of data, a computed error detecting code of that row or column of data with the respective received error detecting code of that row or column of data block.

In an embodiment, the comparator is configured to compare, in the case where there is a mismatch between the computed error detecting code and the respective received error detecting code, the computed error detecting code with a received detecting code of the corresponding row or column of another data packet of the same data.

In an embodiment, a code replacement module is provided for, in the case where the computed error detecting code matches a received detecting code of the corresponding row or column of the other data packet of the same data, replacing the mismatching received error detecting code with the received detecting code of the corresponding row or column of the other data packet In an embodiment, the device is operable to perform the steps of detecting, identifying, determining and replacing are repeated for each data packet until a predetermined condition of a set of predetermined conditions is met.

In an embodiment, the set of predetermined conditions includes reaching a maximum allowed number of iteration, determining that one of the data packets does not contain any erroneous data blocks and/or the remaining number of potentially erroneous data blocks in each data packet has not decreased since the preceding iteration.

In an embodiment, an error counter is provided for counting the detected potentially erroneous blocks in each data packet.

In an embodiment, each data packet is associated with a communication path, the device further comprising a path selector for selecting the communication path associated with the data packet having the lowest count of erroneous blocks for transmission of data.

In an embodiment, the selected communication path is used to transmit acknowledgement of reception of the data packets.

According to a further aspect of the invention there is provided a method of estimating quality of a link among a plurality of links transporting, respectively, a plurality of packets of same data, wherein each packet is encoded using a product code and an encoded packet comprises data blocks organized into rows and columns, each row having a respective error detecting code and each column having a respective error detecting code the method comprising:

detecting erroneous row and column data by means of their associated error detecting code;

identifying, in a data packet transported by the link whose quality is to be estimated, a potentially erroneous data block that belongs to a row and a column of data that both have been detected as erroneous;

determining, in a data packet transported by another link, a non-erroneous data block which corresponds to the identified data block, wherein the data block is determined as non-erroneous if it belongs to at least one row of data blocks or one column of data blocks that has been detected as non-erroneous;

counting the number of identified potentially erroneous data blocks in the data packet whose value differ from the determined corresponding non-erroneous data blocks, the counted number for the data packet being representative of the quality of the link.

This enables an optimal selection of a communication path to be selected. By virtue of the collected erroneous data information for each path, it is possible to detect the occurrence of poor path behavior (for example a second node becoming faulty, a path being subject to interferences in the neighboring, . . . ) allowing real-time reactions such as discarding the use of the concerned second node or dynamically electing the best second node to be used as single return path (instead of systematic successive transmissions through all the second nodes).

In an embodiment, the detecting step comprises comparing, for a row or column of data, a computed error detecting code of that row or column of data with the respective received error detecting code of that row or column of data.

In an embodiment, in the case where there is a mismatch between the computed error detecting code and the respective received error detecting code, the method includes comparing the computed error detecting code with a received detecting code of the corresponding row or column of another data packet of the same data.

In an embodiment, in the case where the computed error detecting code matches a received detecting code of the corresponding row or column of the other data packet of the same data, the method includes replacing the received error detecting code with the received detecting code of the corresponding row or column of the other data packet In an embodiment, the steps of detecting, identifying, and determining are repeated for each data packet until a predetermined condition of a set of predetermined conditions is met.

In an embodiment, the set of predetermined conditions includes reaching a maximum allowed number of iteration, determining that one of the data packets does not contain any erroneous data blocks and/or the remaining number of potentially erroneous data blocks in each data packet has not decreased since the preceding iteration.

In an embodiment, the method includes selecting the link associated with the data packet having the lowest count of erroneous blocks for transmission of data.

In an embodiment, the selected communication path is used to transmit acknowledgement of reception of the data packets.

A further aspect of the invention provides a device for estimating quality of a link among a plurality of links transporting, respectively, a plurality of packets of same data, wherein each packet is encoded using a product code and an encoded packet comprises data blocks organized into rows and columns, each row having a respective error detecting code and each column having a respective error detecting code the device comprising:

an error detector for detecting erroneous row and column data by means of their associated error detecting code and identifying, in a data packet transported by the link whose quality is to be estimated, a potentially erroneous data block that belongs to a row and a column of data that both have been detected as erroneous;

a processor for determining, in a data packet transported by another link, a non-erroneous data block which corresponds to the identified data block, wherein the data block is determined as non-erroneous if it belongs to at least one row of data blocks or one column of data blocks that has been detected as non-erroneous; and an error counter for counting the number of identified potentially erroneous data blocks in the data packet whose value differ from the determined corresponding non-erroneous data blocks, the counted number for the data packet being representative of the quality of the link.

In an embodiment, the error detector comprises a comparator for comparing, for a row or column of data, a computed error detecting code of that row or column of data with the respective received error detecting code of that row or column of data.

In an embodiment, the device includes an error detecting code comparator for comparing, in the case where there is a mismatch between the computed error detecting code and the respective received error detecting code, the computed error detecting code with a received detecting code of the corresponding row or column of another data packet of the same data.

In an embodiment, the device is configured to replace the received error detecting code with the received detecting code of the corresponding row or column of the other data packet in the case where the computed error detecting code matches a received detecting code of the corresponding row or column of the other data packet of the same data, In an embodiment, the device is operable to repeat detecting, identifying, and determining for the data packet until a predetermined condition of a set of predetermined conditions is met.

In an embodiment, the set of predetermined conditions includes reaching a maximum allowed number of iteration, determining that one of the data packets does not contain any erroneous data blocks and/or the remaining number of potentially erroneous data blocks in each data packet has not decreased since the preceding iteration.

In an embodiment, a selector is provided for selecting the link associated with the data packet having the lowest count of erroneous blocks for transmission of data.

In an embodiment, the selected communication path is used to transmit acknowledgement of reception of the data packets.

At least parts of the methods according to the invention may be computer implemented. Accordingly, the present invention may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, the present invention may take the form of a computer program product embodied in any tangible medium of expression having computer usable program code embodied in the medium.

Since the present invention can be implemented in software, the present invention can be embodied as computer readable code for provision to a programmable apparatus on any suitable carrier medium. A tangible carrier medium may comprise a storage medium such as a floppy disk, a CD-ROM, a hard disk drive, a magnetic tape device or a solid state memory device and the like. A transient carrier medium may include a signal such as an electrical signal, an electronic signal, an optical signal, an acoustic signal, a magnetic signal or an electromagnetic signal, e.g. a microwave or RF signal.

BRIEF DESCRIPTION OF THE DRAWINGS

Embodiments of the invention will now be described, by way of example only, and with reference to the following drawings in which.

DETAILED DESCRIPTION

Figure 1:
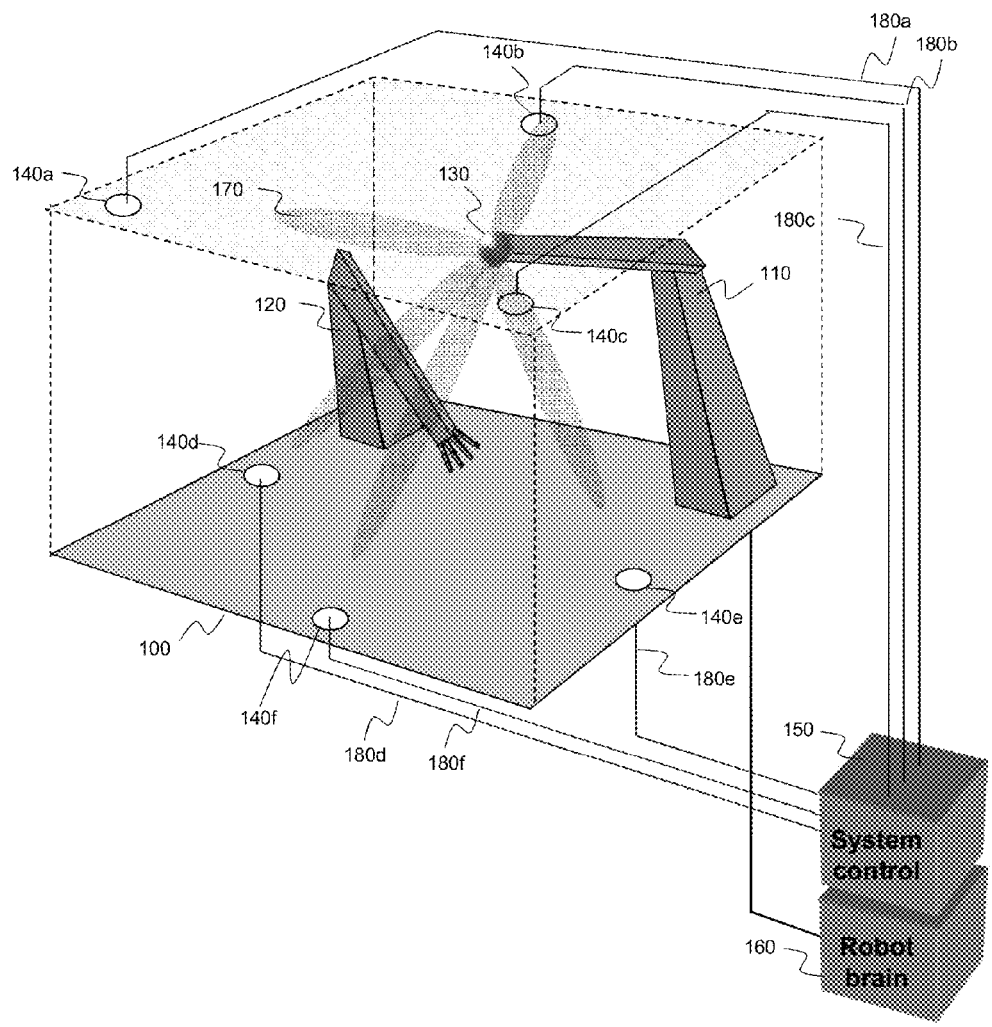
FIG. 1 schematically illustrates an example of a wireless communication system in which one or more embodiments of the invention may be implemented.

FIG. 1 schematically illustrates an example of a wireless communications system in which one or more embodiments of the invention may be implemented. In the exemplary system one movable image source is wirelessly connected to a set of nodes, referred to herein as second nodes which, in this example are fixed. The second nodes are connected to a system control unit. In such a network it is possible to implement methods for iterative multi copy decoding and path quality monitoring, according to an embodiment of the invention.

The wireless communication system comprises an industrial robot having a first arm 110 and one or more additional arms 120. Arm 110 is equipped at its end with at least one image capturing device (for example a video camera or a still image camera) acting as a movable image source. In order to enable the wireless transmission of the captured images, the arm 110 is also equipped at its end with a first node 130 connected to the image capture device. This first node 130 is powered via the robot arm, and is configured to perform communication by means of a wireless link. By virtue of the robot arm 110, the first node 130 has the capability to move around in order for the image capture device to be suitably positioned for observation.

In order, to enable communication with the first node 130 from the place where an image is captured, several second nodes 140a, 140b, 140c, 140d, 140e, 140f, are placed at fixed locations in the robot working space 100, within the wireless coverage area of the first node. In the described embodiment six second nodes are used, but it will be appreciated that the invention could be also applied to any other number of second nodes. In practice the number of second nodes is chosen as a compromise between economical restrictions and efficiency against shadowing. Another advantage of having multiple second nodes is the quality of transmission provided: the global error rate is lower when the transmission can be performed with spatial diversity (i.e. the data may be simultaneously transmitted to several destinations through different paths) for the same data than when there is only one path. The second nodes 140a, 140b, 140c, 140d, 140e, 140f are connected to a system control 150 via links 180a, 180b, 180c, 180d, 180e, 180f respectively. In one particular embodiment, a modem is included in each second node and the interconnection between the second nodes and the system control is performed by means of digital high speed interfaces using differential signals. Such high speed wired interfaces may be point to point organized, or may be bus oriented; they may be 1000BaseT or compliant with any other standard, or may be proprietary and use any physical medium enabling a high data rate: twisted pairs, optical fibre, coaxial cable, or wireless. Other embodiments could be envisaged where the interconnection physical medium is analogue and modems are included in the system control instead of in the second nodes. It will be appreciated that this list of interconnection possibilities is not exhaustive. The system control 150 acts as a central unit and is linked with the robot brain 160.

Since one application is for the wireless transportation of high definition images, 60 GHz millimeter waves are used for the high bandwidth transmission. A drawback of using 60 GHz millimeter waves is the Line Of Sight propagation characteristics: obstacles can block the RF beams 170 between the emitter and the receiver. The arm 120 used for object manipulations, may in some circumstances be positioned in the Line Of Sight of some paths between the first node 130 and one or more second nodes 140. Consequently in some cases the arm 120 may disrupt the wireless communication between the first node 130 and the second nodes 140a, 140b, 140c, 140d, 140e, 140f.

For better wireless transmissions, the first node should 130 have a wide angle antenna allowing potential connectivity with many of the second fixed nodes. The second fixed nodes may communicate through a high speed link with the system control gathering the multiple copies of the transmitted data packet.

Figure 2A:
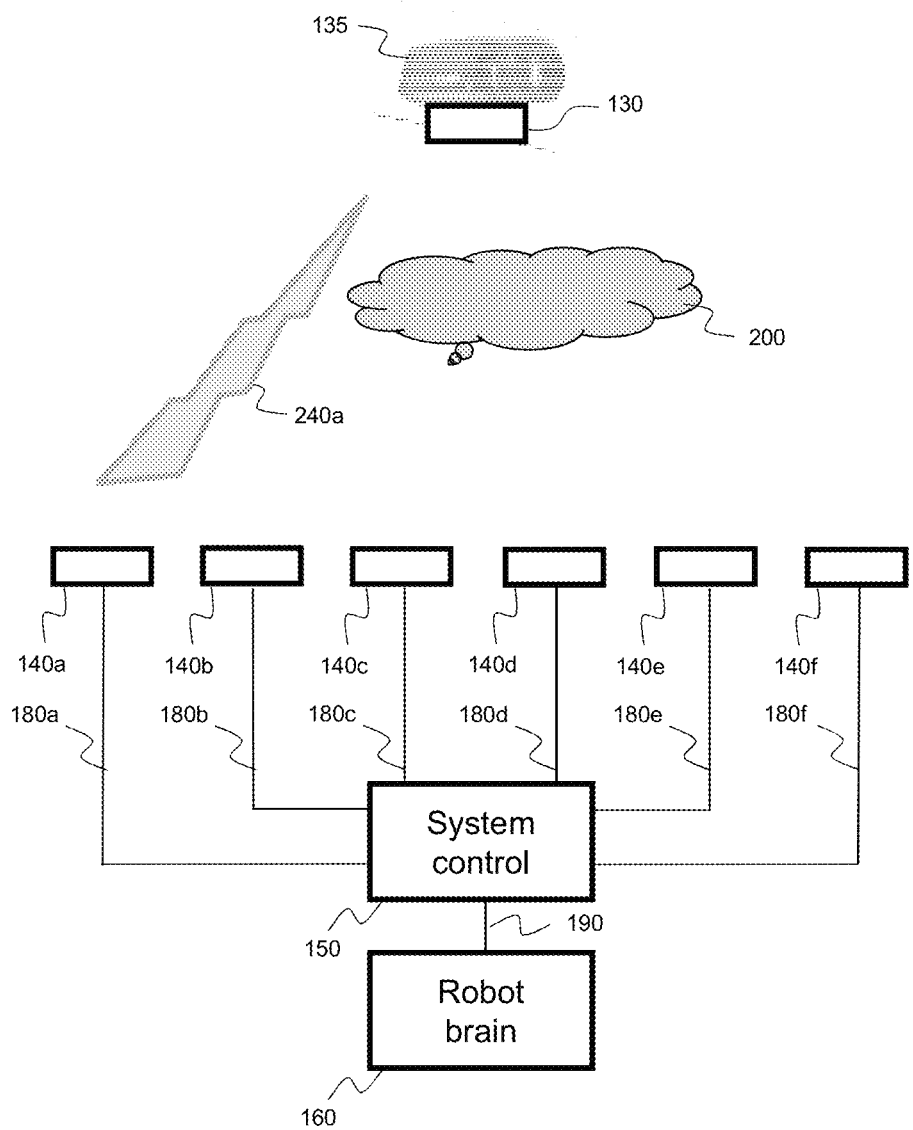
FIG. 2a schematically illustrates elements of a wireless communications network in which one or more embodiments of the invention may be implemented in the case where a second node 140a is transmitting and a first node 130 is receiving.

FIG. 2a is a functional view of the wireless communications network of FIG. 1. The first node 130 is connected to at least one image capture device 135 (video camera or still image camera). A robot brain 160 is connected to the system control 150 via a link 190. The various second nodes 140a, 140b, 140c, 140d, 140e, 140f are connected to the system control 150 via links 180a, 180b, 180c, 180d, 180e, 180f, respectively. It may be recalled that in this example the second nodes are fixed, but the first node 130, attached to the arm of the robot, can move between two data communication sequences. After one robot cycle with one communication sequence, the robot arm 110 can move to a different position for a new robot cycle in which the effectiveness of the communication paths between the first node 130 and each of the second nodes 140a, 140b, 140c, 140d, 140e, 140f is unknown: some paths may be valid with their own individual quality (and thus their own individual bit error rate), while some others could be disrupted by one or more obstacles 200. FIG. 2a schematically illustrates a radio communication 240a transmitted from the second node 140a towards the first node 130.

Figure 2B:
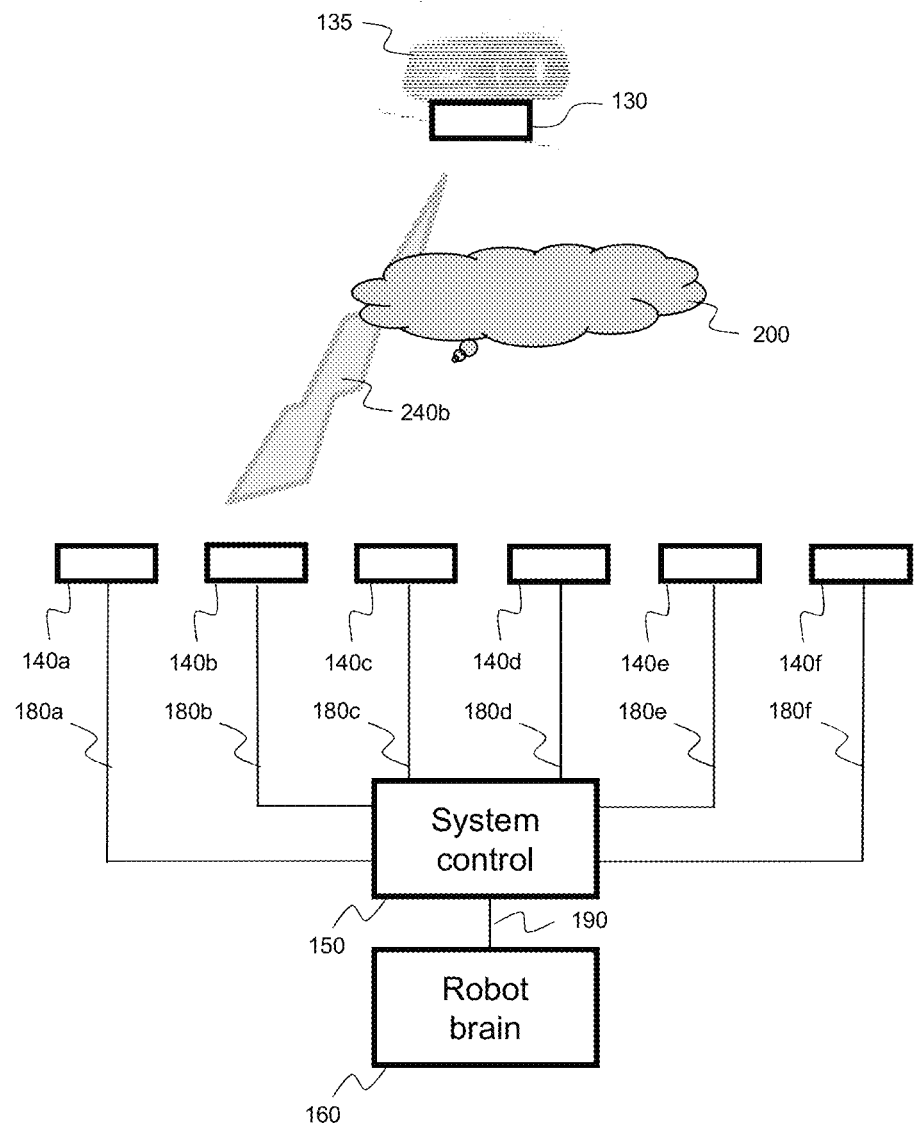
FIG. 2b schematically illustrates the main elements of the wireless communications network of FIG. 2a, in the case where a second node 140b is transmitting and a first node 130 is receiving.

FIG. 2b is similar to FIG. 2a, but schematically illustrates a radio communication 240b transmitted from the second node 140b towards the first node 130. It may be the case that this path demonstrated good performance in a previous robot cycle when the first node 130 was located in another position, but now the communication path is disrupted. In this example, the millimeter wave reception at the first node 130 from the second node 140b is not of good quality since the obstacle 200 prevents a correct Line Of Sight reception being provided between the first node 130 and the second node 140b.

Figure 2C:
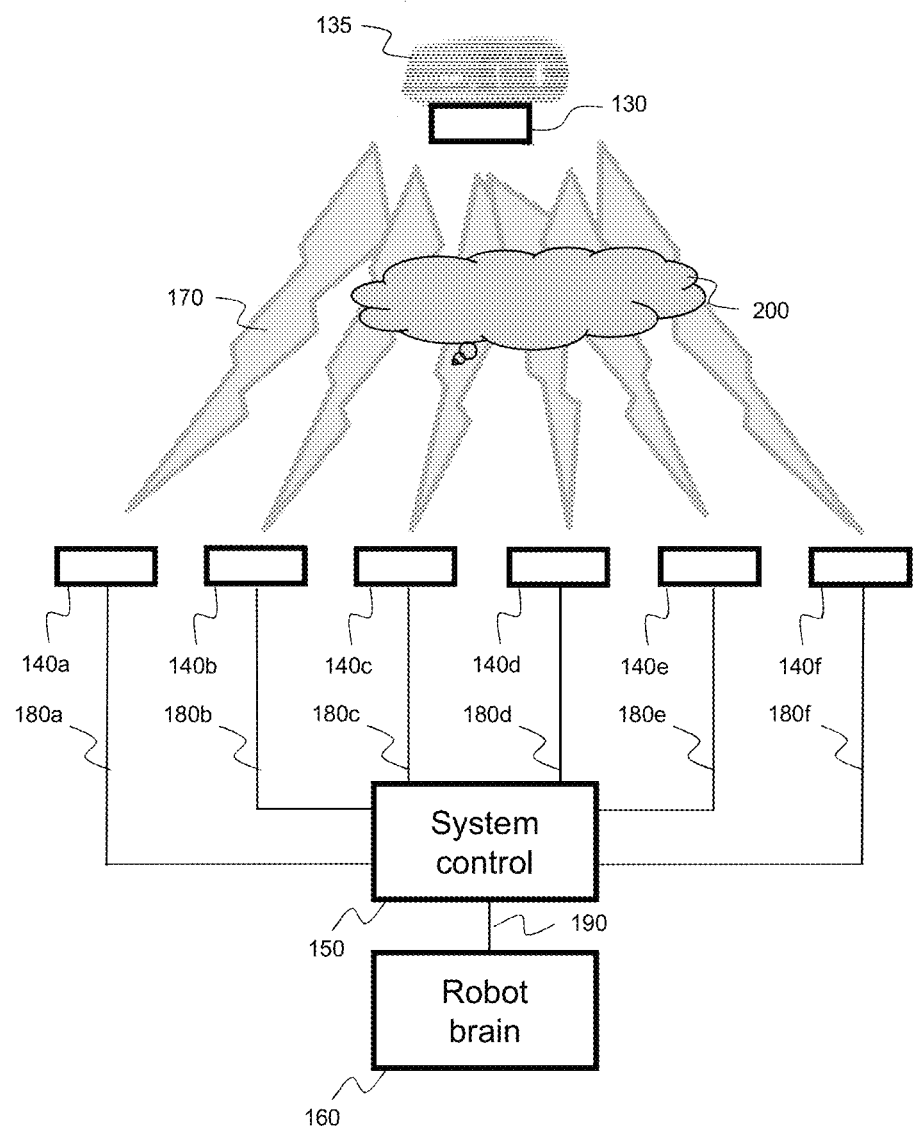
FIG. 2c schematically illustrates the main elements of the wireless communications network of FIG. 2a, in the case where a first node 130 is transmitting in multi-directions and a plurality of second nodes 140a, 140b, 140c, 140d, 140e and 140f are configured in reception mode towards the first node 130.

FIG. 2c schematically illustrates the first node 130 transmitting a radio communication 170 towards all of the second nodes 140a, 140b, 140c, 140d, 140e and 140f which are each awaiting a signal from the first node 130. It may be noted that, the reception at some of the second nodes 140a, 140b, 140c, 140d, 140e, 140f may be of poor quality due to problems such as radio path shadowing 200.

Figure 3:
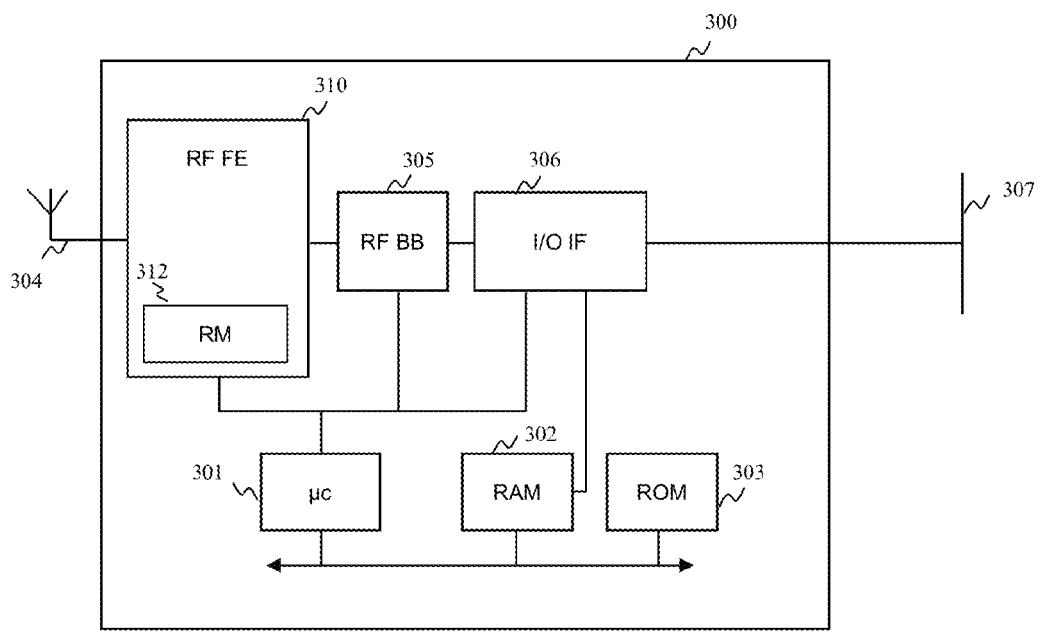
FIG. 3 presents the schematic structure of a communications device 130, 140a to 140f implementing the iterative multi-copy decoding according to a particular embodiment of the invention.

FIG. 3 schematically illustrates an example of a structure of a communication device of the first node 130 or of any of the second nodes 140a, 140b, 140c, 140d, 140e or 140f used in a system such as the wireless system of FIG. 1.

The communication device 300 comprises:
  a RAM (Random Access Memory) 302 operating as a main memory;
  a computation block 301 (denoted μc for "micro-controller") or CPU (Control Process Unit) whose capacity can be extended by an optional random-access memory connected to an expansion port (not shown in FIG. 3). The CPU 301 is capable of executing instructions from the ROM 303. After the system has been powered on, the CPU 301 is capable of executing instructions from the RAM 302 pertaining to a computer program, once these instructions have been loaded from the ROM 303 or an external memory (not shown in the present FIG. 3).
  a communication block 310 (denoted RF-FE or front-end) operable to match the output signal of the baseband block 305 (RF-BB or RF-baseband) before it is transmitted by means of an antenna 304. For example, the matching can be done by frequency transposition and power amplification processes. Conversely, block 305 also enables the matching of a signal received by the antenna 304 before it is transmitted to the baseband block 305. The baseband block 305 is operable to modulate and demodulate the digital data exchanged with the block 310. The communication block 310 has a sub-block 312 (denoted as RM for Reception Measurement) comprising, for example, an ADC (analogue-digital converter) whose task is to measure the power of the signal received through the antenna 304, the power measurement value being then communicated to the CPU 301;
  an input/output interface (I/O I/F) block 306 connected (307) to an image capture device 135 in the case where the communication device is the first node 130; or connected to the system control 150 via links 180a, 180b, 180c, 180d, 180e, 180f in the case where the communication device is one of the second nodes 140a, 140b, 140c, 140d, 140e or 140f.

The system control 150 embeds an input/output interface for handling the multiple links 180a, 180b, 180c, 180d, 180e, 180f; it is also equipped with a processor and associated memories; a computer program, if executed by the CPU of the system control, prompts the execution of a part or of the totality of the steps of the algorithms described here below with reference to FIGS. 5, 6 7 and 8.

Figure 4:
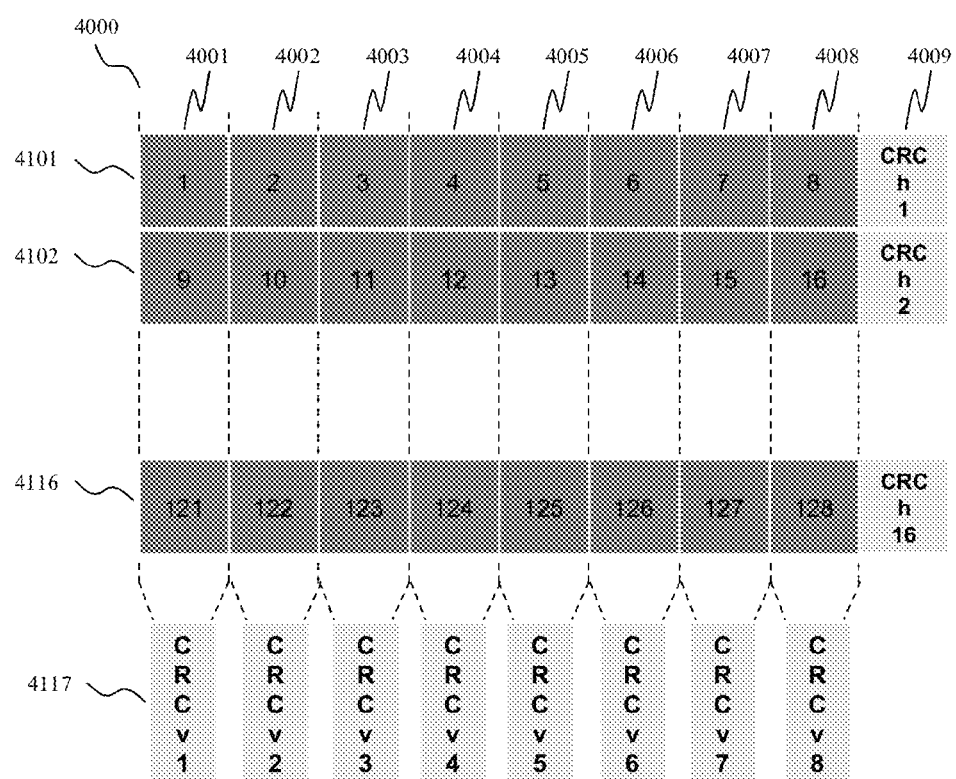
FIG. 4 illustrates an example of the matrix organization of the transmitted data block, based on CRC product codes.

FIG. 4 schematically illustrates an example of the matrix organization 4000 of the transmitted data packet, based on CRC product codes. The data packet is composed of data blocks arranged in rows and columns of data. In this example the data blocks of the data packet are arranged 16 rows of 8 columns for the data payload, and one additional byte (horizontal CRC) is included per row and one additional byte (vertical CRC) is included per column.

The considered data packet has a total size of 216 bytes, representative of 128 elementary payload data of 12 bits width.

The first row comprises 8 payload data blocks (4001/4101, 4002/4101, 4003/4101, 4004/4101, 4005/4101, 4006/4101, 4007/4101, 4008/4101) and 1 byte of horizontal Cyclic Redundancy Check (4009/4101); the second row also comprises 8 payload data blocks (4001/4102, 4002/4102, 4003/4102, 4004/4102, 4005/4102, 4006/4102, 4007/4102, 4008/4102) and 1 byte of horizontal Cyclic Redundancy Check (4009/4102); . . . and so on up to the $16^{th}$ row comprising 8 payload data blocks (4001/4116, 4002/4116, 4003/4116, 4004/4116, 4005/4116, 4006/4116, 4007/4116, 4008/4116) and 1 byte of horizontal Cyclic Redundancy Check (4009/4116). As a result, the column 4009 comprises 16 bytes of horizontal CRCs.

The first column is composed of 16 payload data blocks (4001/4101, 4001/4102, 4001/4103, 4001/4104, 4001/4105, 4001/4106, 4001/4107, 4001/4108, 4001/4109, 4001/4110, 4001/4111, 4001/4112, 4001/4113, 4001/4114, 4001/4115, 4001/4116) and of 1 byte of vertical Cyclic Redundancy Check (4001/4117); the second column is composed of 16 payload data blocks (4002/4101, 4002/4102, 4002/4103, 4002/4104, 4002/4105, 4002/4106, 4002/4107, 4002/4108, 4002/4109, 4002/4110, 4002/4111, 4002/4112, 4002/4113, 4002/4114, 4002/4115, 4002/4116) and of 1 byte of vertical Cyclic Redundancy Check (4002/4117); . . . and so on up to the $8^{th}$ column comprising 16 payload data blocks (4008/4101, 4008/4102, 4008/4103, 4008/4104, 4008/4105, 4008/4106, 4008/4107, 4008/4108, 4008/4109, 4008/4110, 4008/4111, 4008/4112, 4008/4113, 4008/4114, 4008/4115, 4008/4116) and 1 byte of vertical Cyclic Redundancy Check (4008/4117). Line 4117 comprises 8 bytes of vertical CRCs.

In communication systems, a data packet is typically composed of several consecutive CRC product code blocks. For example a data packet of 55 Kbytes may be composed of more than 250 blocks of 216 bytes.

In embodiments of the invention transmitted data packets may be product code organized; this matrix organization is based on rows, with a CRC per row, and columns with a CRC per column. The columns can have a bit width organization depending on the data element characteristics: for example the column could be arranged by 12 bits if the pixels to transfer are 12 bits width. In such way it is possible to have error detection at the data element level. It is also possible to adjust the overall redundancy to the available network throughput: number of row and column per data block;

It may be noted that all the above parameters of the matrix are only introduced as an example; and that any other configuration of rows and columns could be used in the context of the invention. Methods according to embodiments are flexible and could be applied to any elementary data unit width while adjusting the number of vertical CRCs accordingly.

Figure 5:
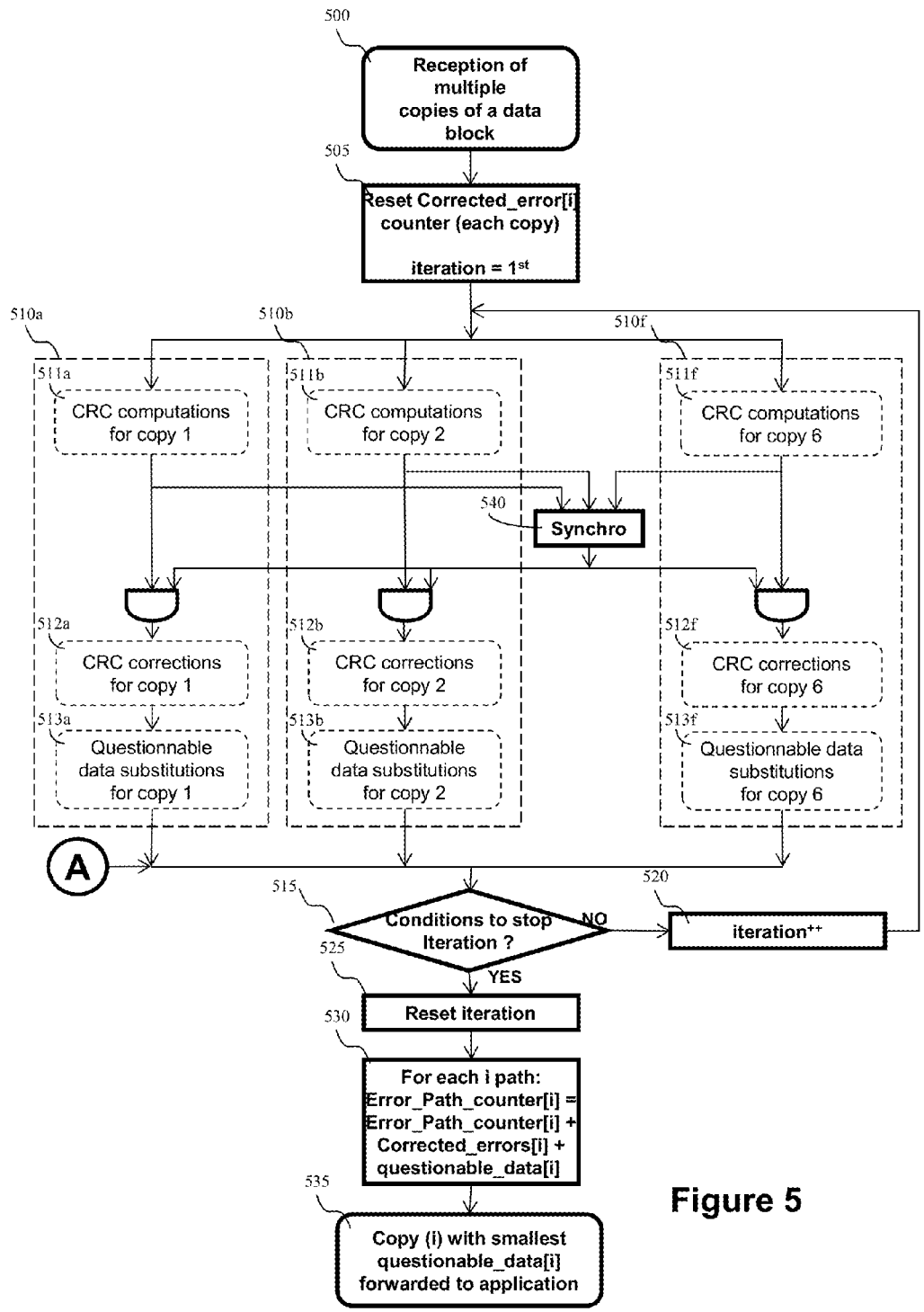
FIG. 5 is a flowchart illustrating steps of a method in accordance with an embodiment of the invention for detecting potentially erroneous data blocks in a data packet.

FIG. 5 is a flow chart of steps of a process performed by the system control node 150 in accordance with an embodiment of the invention. In step 500 multiple copies of a data packet 4000 (i.e. a plurality of packets of the same data) are received and thus made available for error detection and correction processes. In subsequent step 505 an error counter for the received data packet and associated with each of the second nodes 140a, 140b, 140c, 140d, 140e or 140f is reset and an iteration parameter is set to 1 to indicate the start of the first iteration.

Next, detection and correction processes (steps 510a, 510b, 510c, 510d, 510e, 510f) are performed simultaneously, in parallel, on the copies of data packets received respectively by the second nodes 140a, 140b, 140c, 140d, 140e or 140f from the first node 130. The set of process steps 510a for the second node 140a includes a sub-step 511a in which CRC computations for copy 1 of the data packet are performed. Sub-step 511a includes the process of FIG. 6 for the computation of CRCs. Sub-step 511a is followed by a sub-step 512a in which potential correction of the received CRCs of the data copy 1 is performed. Step 512a includes the process of FIG. 7. In subsequent sub-step 513a potential correction of the questionable (i.e. potentially erroneous) elementary data is performed. Step 513a includes the process of FIG. 8. Similarly, the set of processes 510b for the second node 140b includes sub-step 511b in which the CRC computations for copy 2 of the data packet are performed (511b corresponding to the process of FIG. 6), followed by sub-step 512b in which the potential correction of the received CRCs of copy 2 of the data packet is performed (512b corresponding to the process of FIG. 7), then in sub-step 513b the potential correction of the questionable elementary data is performed (513b corresponding to the process of FIG. 8). Each of the second nodes 140c to 140f performs a similar set of processes to those performed by second nodes 140a and 140b.

A synchronization step 540 is performed to make sure that each of steps 512a to 512f begin when each of steps 511a to 511f have respectively finished computing the CRCs. While at the first iteration the same amount of CRCs is computed for all paths, from the second iteration onwards there may be different amounts of CRC computation to perform for each path.

While in this particular embodiment the detection and correction processes are carried out simultaneously on the data packet copies, it will be appreciated that in other embodiments the detection and correction processes need not be carried out simultaneously. For example, in another embodiment of the invention, the steps for the detection and correction process (510a, 510b, 510c, 510d, 510e, 510f) could be performed successively.

The following step 515 starts when all the detection and correction processes (510a, 510b, 510c, 510d, 510e, 510f) have finished. Step 515 is performed to determine if any pre-set condition for stopping the iterations of processes 510a-510f has been satisfied. During the step 515, it is verified if:

the maximum number of allowed iterations has been reached, one of the data packet copies does not contain any errors, the remaining number of questionable data blocks in each of the data packet copies has not decreased from the previous iteration.

When the result of any of the above checks is positive, the process proceeds to step 525 in order to reset the iteration count. Otherwise it is considered that corrections may still be applied to the data packet and so a new iteration is performed from step 520 enabling the detection and correction process (510a, 510b, 510c, 510d, 510e, 510f) to be performed once again for the copies of the data packet received, from the first node 130, by the second nodes 140a, 140b, 140c, 140d, 140e or 140f respectively.

Reaching step 525 indicates that the correction process has been completed for the all the copies of the current data packet, and so the iteration indicator can be reset. During subsequent step 530, for each i path the count of errors for the current packet of data is determined by adding the number of errors that have been corrected (Corrected_errors [i]) and the number of remaining questionable data blocks (questionable_data[i]). The cumulative error count of each path (Error_Path_counter[i]) is updated by adding the above number of errors of the current packet with respect to each data packet copy, and so linked to the associated path.

In step 535, the copy of the current data packet having the smallest questionable data block count is considered to be the most reliable and is forwarded to the application.

The cumulated error count for each i path (Error_Path_counter[i]) is used to estimate the transmission quality of each i path. For example, the transmission quality so estimated may be used to dynamically select the best return path to send back packet acknowledgements via only one second node instead of performing systematic successive transmissions through all of the second nodes. The cumulated error counter may also be used to detect the occurrence of poor path behaviour (for example: a second node becoming faulty, emergence of interferences in the neighbouring area . . . ) allowing real-time reactions such as discarding the use of the concerned second node, or providing an alert. After usage of the Error_Path_counter[i] associated with each i path, the counter is reset in order to be ready to estimate once again the quality of each i path.

For each path, counting all the performed questionable data block substitutions and the remaining questionable data blocks which could not be resolved, enables a representative estimation of the real errors to be obtained. In one or more embodiments of the invention to provide path quality representativeness in a more efficient manner, unnecessary questionable data substitutions may be prevented by performing a data comparison before the replacement.

In another embodiment, the i path quality estimation is carried out by performing a comparison between the initial data block received of the i copy with the final data block after the iterations have been done: the count of the differences indicating the number of corrected data blocks.

Figure 6:
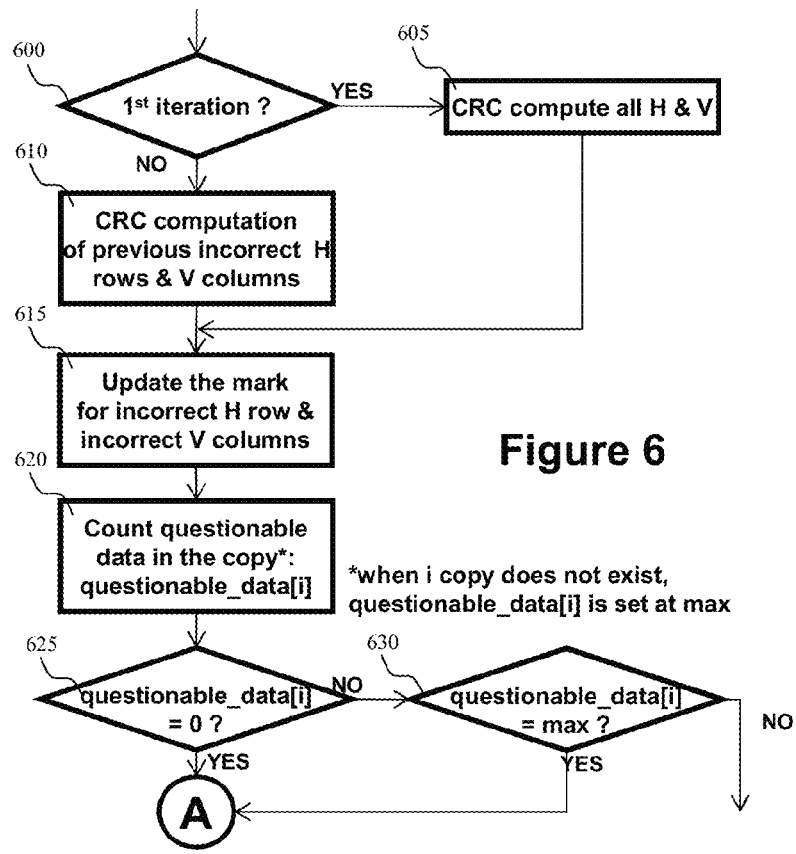
FIG. 6 is a flowchart illustrating steps of a method for the CRC computation in accordance with an embodiment of the invention.

FIG. 6 is flowchart illustrating steps of a process for computing CRCs. The process is performed after reception of a copy of the data packet for an i communication path. This process may also be performed during subsequent iterations for previous CRCs considered to be incorrect.

In step 600, it is checked if the current iteration is the first iteration. If the current iteration is the first iteration the process proceeds to step 605 in which all row and column CRCs of the current data packet copy are computed, before proceeding to step 615. If the current iteration is not the first iteration, in step 610 the row and column CRCs are computed for the current data block, but only for the CRCs which were previously marked as incorrect (i.e. the computed CRC does not match the received CRC).

In subsequent step 615, an update is performed for the status attributed to the CRCs. If the iteration is the first iteration: all row and column CRCs of the current data packet are marked or rated (good or incorrect); in the case of another iteration, a previous CRC considered to be an incorrect CRC may be updated to good if the computed CRC now matches the received CRC.

A questionable or potentially erroneous data block is a data block with uncertainty about its status: it could be good, but it could also be erroneous. Then in step 620 the number of questionable data blocks of the current data packet is estimated, this is performed by counting the number of intersections which occur between rows having incorrect CRCs with columns having incorrect CRCs. For each i path, the count of questionable data blocks is stored in questionable_data[i]. The counter is set to the maximum value (for example 216 if this is the size of a data block) for missing copies of the data packet.

In step 625, a counter having a count equal to zero indicates that no incorrect CRC has been detected in the data packet, so all the data blocks can be considered as good and the process proceeds to step 515 of FIG. 5 where one of the conditions to stop iterations is satisfied (i.e. stop iteration condition because one of the data packet copies received does not contain any errors). Otherwise, if the questionable data block counter is not zero, indicating that there are some incorrect CRCs in the data block, the process proceeds to step 630 of FIG. 6, where it is checked to verify if no significant data packet has been received, i.e. the questionable data block counter has been set to the max count. In this case the process proceeds to step 515 of FIG. 5. In the case where in step 630 it is determined that the current data packet contains some errors, but the estimation has not reached the maximum size of the data packet, it is possible to continue the process towards the potential CRC correction set out in FIG. 7

Figure 7:
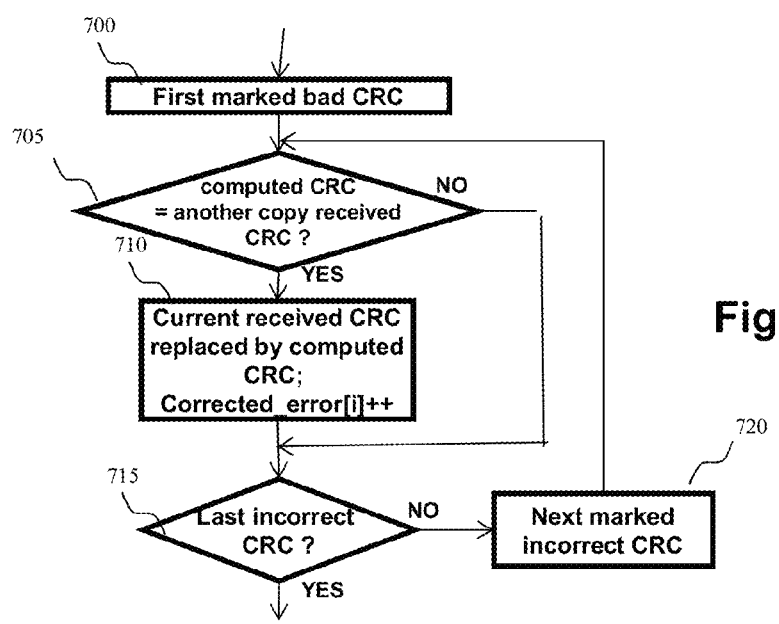
FIG. 7 is a flowchart illustrating steps of a method for CRC correction in accordance with an embodiment of the invention when the computed CRC mismatches the received CRC, but is equal to at least a received CRC from another data packet copy.

FIG. 7 is a flowchart illustrating steps of a method for performing CRC correction when appropriate, in accordance with an embodiment of the invention. This method is performed when the computed CRC mismatches the received CRC, but is equal to at least a received CRC from another data packet copy.

Step 700 indicates the first CRC marked with an incorrect status, i.e. the CRC computed from the received associated data is different from the received CRC.

Then in step 705 a check is performed to determine if the CRC computed from the received associated data is equal to the received CRC from another copy of the same data packet.

In the case where the CRC computed from the received associated data matches the received CRC from another copy of the data, the received CRC of the current data packet copy is replaced in step 710 by the CRC of the other data packet copy which matches the computed CRC of the current row or column. In general a match between the computed CRC from the received associated data and the received CRC from another copy of the data packet is possible if the received data packet associated with the current CRC attributed an incorrect status is good. After the substitution of the erroneous CRC by the good CRC, the count of corrections performed in the current copy of the current block (Corrected_error[i]) is incremented by one unit before the process proceeds to step 715.

In the case where the CRC computed from the received associated data does not match the received CRC from another copy of the data it is not possible to correct the received CRC, and the process proceeds to step 715.

In step 715, it is verified if the current CRC initially marked as incorrect, is the last incorrect CRC of the current data packet copy. If there is no other identified incorrect CRC, the process proceeds to the process of substitution of the potential questionable data block as set out in FIG. 8; otherwise the process returns to step 705 to consider another CRC marked as incorrect.

Figure 8:
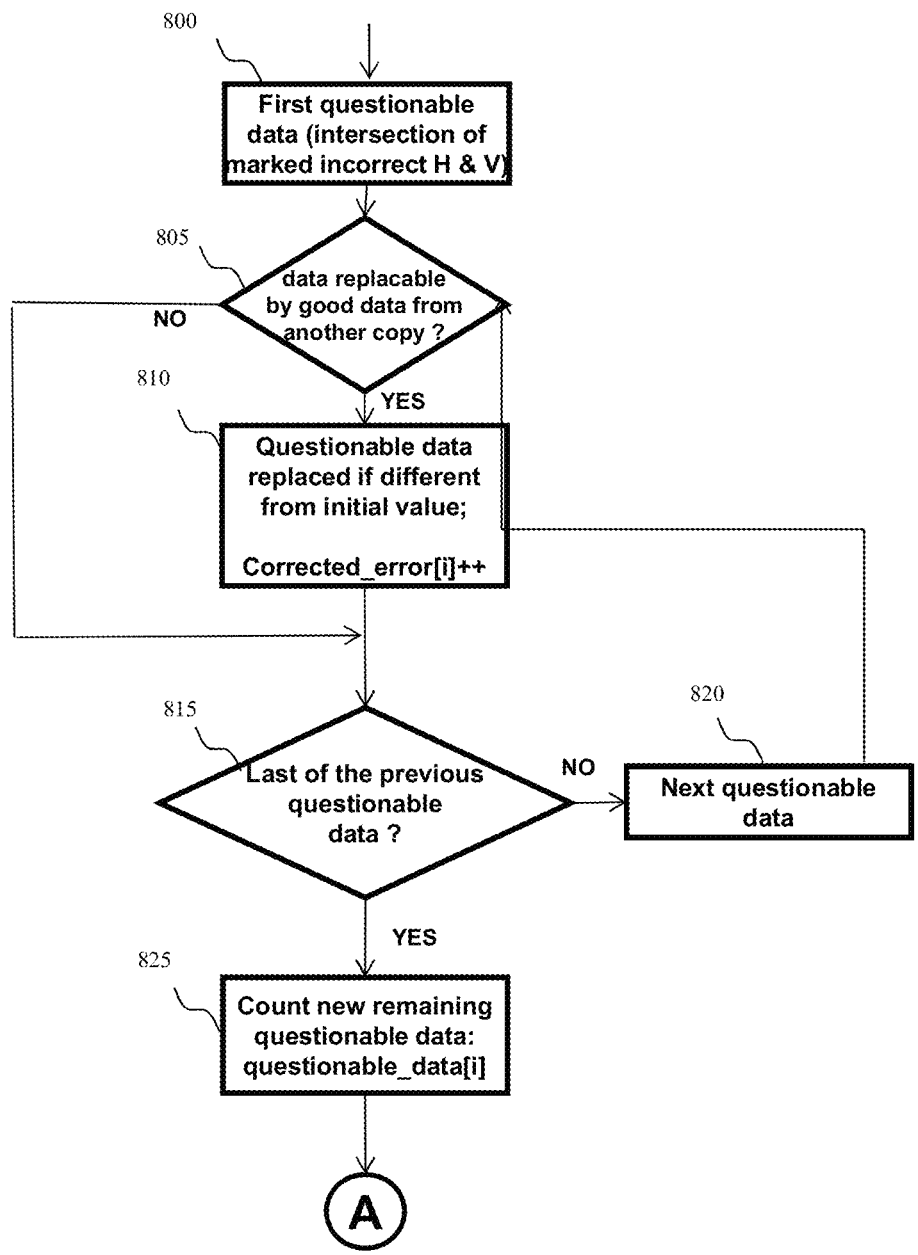
FIG. 8 is a flowchart illustrating steps of a method for replacement of the potentially erroneous data by good data from another data packet copy according to an embodiment of the invention.

FIG. 8 is a flowchart illustrating steps of a process, in accordance with an embodiment of the invention for replacement of data considered to be questionable (potentially erroneous) in a data packet copy by data considered to be good from another copy of the data packet. The process starts at step 800 where the first questionable data block is indicated (intersection of a row having a CRC considered to be incorrect with a column having a CRC considered to be incorrect). Next in step 805, it is checked as to whether this questionable data block can be replaced by a good data block at the same position in another copy of the data. This signifies that the potential replacement data is not located at an intersection of a row having an incorrect CRC with a column having an incorrect CRC in that data packet copy.

In the case where it is determined in step 805 that the questionable data block may be substituted by a good data block from another copy of the data packet, the substitution is performed in step 810 stage and the counter of corrections performed in the current copy of the current data packet (Corrected_error[i]) is incremented by one unit. Step 810 is followed by step 815.

Nevertheless it may not be necessary to perform this substitution in the case where the initial questionable data is already equal to the good replacement value. This would lead to an optimization of the substitutions performed, and would provide an error count (Corrected_error[i]) more representative of the real errors in the current copy of the data packet. In the case where the substitution is not necessary, the count of corrections performed in the current copy of the current data packet (Corrected_error[i]) would not need to be incremented. In the case of a negative outcome at step 805, i.e. the questionable data block may not be substituted by a good data block from another copy of the data packet, since it is not possible to correct the received data, the process proceeds to step 815. Thus in order to have substitutions representative of the errors received in the copy (and not systematic substitutions), a substitution is not performed when the questionable data block would be replaced by a good data block having the same value (in such case the substitution is useless because the questionable data block is in fact already good).

In step 815, it is checked as to whether the current questionable data block is the last questionable block of the current data packet copy. If there is no further identified questionable data blocks in the current data packet copy, the process will count the remaining potential questionable data blocks in step 825 and will update the questionable_data[i] number for the current i copy of the current data packet; otherwise the process proceeds to step 820 to consider another questionable data block of the current data packet. After step 825, the next step is 515 of FIG. 5 (stop iteration condition because one of the data copies does not contain any error).

Some embodiments of the invention provide methods which enable data (Multi-Rx ECC mechanism) coming from several paths to be recovered efficiently while keeping a good coding ratio and which provide estimations in normal operation of the reception quality of each second fixed node in order to detect in real time faulty paths (due to breakdown, interferences, . . . ) between the movable first node and the second fixed nodes and enable an optimized return path for acknowledgements to be selected Embodiments of the invention may exploit reliable received CRCs in order to perform efficient data recovery. Correction of received incorrect CRCs when the computed CRC mismatches the received CRC, but is equal to at least another received CRC (same position in another copy of the same data).

Embodiments of the invention set out to perform correction of the potentially erroneous data; by substitution of the potentially erroneous data of one copy by reliable data at the same place of another copy. Further optimization in some embodiments of the invention may include preventing substitution of the potentially erroneous data when a replacement data block is identical to the data block to be replaced. While there are remaining potentially erroneous data blocks, or the maximum number of iterations has not been reached, or there are still corrections to be performed, the entire process may be restarted: CRC computation of the row/column previously identified with errors, an attempt to correct the received incorrect CRC which mismatches the computed CRC, substitution of potentially erroneous data of one copy by a good data at the same place of another copy.

In at least one embodiment of the invention methods may be provided enabling the quality of each path to be estimated by counting the effective substitutions and the remaining unchanged potentially erroneous data blocks.

Some embodiments of the invention have the advantage that they may be applied to means traditionally used for transmitting data within a wireless communications network.

Embodiments of the invention provide techniques that are simple to implement and do not require too much extra overhead.

Although the present invention has been described hereinabove with reference to specific embodiments, the present invention is not limited to the specific embodiments, and modifications will be apparent to a skilled person in the art which lie within the scope of the present invention.

For example while the embodiments have been described with reference to a wireless system it will be appreciated that the invention is not limited to wireless transmission systems, but may be extended to any system where several copies of same data are available: multiple retransmissions through relays, storage systems where several read access could provide different results (hard-disks, CD, DVD, . . . ).

Many further modifications and variations will suggest themselves to those versed in the art upon making reference to the foregoing illustrative embodiments, which are given by way of example only and which are not intended to limit the scope of the invention, that being determined solely by the appended claims. In particular the different features from different embodiments may be interchanged, where appropriate.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used.

The invention claimed is:

1. A method of decoding multiple copies of a data packet, wherein each copy of the data packet is encoded using a product code and an encoded copy of the data packet comprises data blocks organized into rows and columns, each row having a respective error detecting code and each column having a respective error detecting code the method comprising for a copy of the data packet:
  detecting erroneous row and column data by means of their associated error detecting code;
  identifying, in the copy of the data packet, a potentially erroneous data block that belongs to a row and a column of data blocks that both have been detected as erroneous;
  determining, in another copy of the data packet, a non-erroneous data block corresponding to the identified potentially erroneous data block, wherein the data block is determined as non-erroneous if it belongs to at least one row of data or one column of data that has been detected as non-erroneous; and
  replacing the identified potentially erroneous block by the determined non-erroneous block.

2. The method according to claim 1 wherein the detecting step comprises comparing, for a row or column of data, a computed error detecting code of that row or column of data with the respective received error detecting code of that row or column of data.

3. The method according to claim 2, further comprising, in the case where there is a mismatch between the computed error detecting code and the respective received error detecting code, comparing the computed error detecting code with a received detecting code of the corresponding row or column of another copy of the data packet.

4. The method according to claim 3 further comprising, in the case where the computed error detecting code matches a received detecting code of the corresponding row or column of the other copy of the data packet, replacing the mismatching received error detecting code with the received detecting code of the corresponding row or column of the other copy of the data packet.

5. The method according to claim 1 wherein the steps of detecting, identifying, determining and replacing are repeated for each copy of the data packet until a predetermined condition of a set of predetermined conditions is met.

6. The method according to claim 5 wherein the set of predetermined conditions includes reaching a maximum allowed number of iteration, determining that one of the copies of the data packet does not contain any erroneous data blocks and/or the remaining number of potentially erroneous data blocks in each copy of the data packet has not decreased since the preceding iteration.

7. The method according to claim 1 further comprising counting the detected potentially erroneous blocks for each copy of the data packet.

8. The method according to claim 7 wherein each copy of the data packet is associated with a communication path, the method further comprising selecting the communication path associated with the copy of the data packet having the lowest count of erroneous blocks for transmission of data.

9. The method according to claim 8 wherein the selected communication path is used to transmit acknowledgement of reception of the copies of the data packet.

10. A device for decoding multiple copies of a data packet, wherein each packet is encoded using a product code and an encoded packet comprises data blocks organized into rows and columns, each row having a respective error detecting code and each column having a respective error detecting code the device comprising:
  an error detector for detecting, in a copy of the data packet, erroneous row and column data by means of their associated error detecting code and for identifying, in a copy of the data packet, a potentially erroneous data block that belongs to a row and a column of data blocks that both have been detected as erroneous;
  a processor for determining, in another copy of the data packet, a non-erroneous data block corresponding to the identified potentially erroneous datablock, wherein the data block is determined as non-erroneous if it belongs to at least one row of data or one column of data that has been detected as non-erroneous; and
  replacing the identified potentially erroneous block by the determined non-erroneous block.

11. The device according to claim 10 wherein the error detector comprises a comparator for comparing, for a row or column of data, a computed error detecting code of that row or column of data with the respective received error detecting code of that row or column of data block.

12. The device according to claim 11, wherein the comparator is configured to compare, in the case where there is a mismatch between the computed error detecting code and the respective received error detecting code, the computed error detecting code with a received detecting code of the corresponding row or column of another copy of the data packet.

13. The device according to claim 12 further comprising a code replacement module for, in the case where the computed error detecting code matches a received detecting code of the corresponding row or column of the other copy of the data packet, replacing the mismatching received error detecting code with the received detecting code of the corresponding row or column of the other copy of the data packet.

14. The device according to claim 10 wherein the device is operable to perform the steps of detecting, identifying, determining and replacing are repeated for each copy of the data packet until a predetermined condition of a set of predetermined conditions is met.

15. The device according to claim 14 wherein the set of predetermined conditions includes reaching a maximum allowed number of iteration, determining that one of the copies of the data packet does not contain any erroneous data blocks and/or the remaining number of potentially erroneous data blocks in each data packet has not decreased since the preceding iteration.

16. The device according to claim 10 further comprising an error counter for counting the detected potentially erroneous blocks in each copy of the data packet.

17. The device according to claim 16 wherein each copy of the data packet is associated with a communication path, the device further comprising a path selector for selecting the communication path associated with the copy of the data packet having the lowest count of erroneous blocks for transmission of data.

18. The device according to claim 17 wherein the selected communication path is used to transmit acknowledgement of reception of the copies of the data packet.

19. A method of estimating quality of a link among a plurality of links transporting, respectively, multiple copies of a data packet, wherein each copy of the data packet is encoded using a product code and an encoded packet comprises data blocks organized into rows and columns, each row having a respective error detecting code and each column having a respective error detecting code the method comprising:
  detecting erroneous row and column data by means of their associated error detecting code;
  identifying, in a copy of the data packet transported by the link whose quality is to be estimated, a potentially erroneous data block that belongs to a row and a column of data that both have been detected as erroneous;

determining, in a copy of the data packet transported by another link, a non-erroneous data block which corresponds to the identified data block, wherein the data block is determined as non-erroneous if it belongs to at least one row of data blocks or one column of data blocks that has been detected as non-erroneous;

counting the number of identified potentially erroneous data blocks in the copy of the data packet whose value differ from the determined corresponding non-erroneous data blocks, the counted number for the copy of the data packet being representative of the quality of the link.

\* \* \* \* \*